United States Patent
Gautama

(10) Patent No.: US 10,396,743 B2
(45) Date of Patent: Aug. 27, 2019

(54) FREQUENCY-DOMAIN DYNAMIC RANGE CONTROL OF SIGNALS

(71) Applicant: NXP B.V., Eindhoven (NL)

(72) Inventor: Temujin Gautama, Boutersem (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/141,904

(22) Filed: Apr. 29, 2016

(65) Prior Publication Data

US 2016/0322949 A1    Nov. 3, 2016

(30) Foreign Application Priority Data

May 1, 2015    (EP) .................................... 15166123

(51) Int. Cl.
| | |
|---|---|
| H03G 5/16 | (2006.01) |
| H03G 3/30 | (2006.01) |
| H04R 3/04 | (2006.01) |
| H03G 9/00 | (2006.01) |
| H03G 9/02 | (2006.01) |

(52) U.S. Cl.
CPC ............. H03G 5/165 (2013.01); H03G 3/301 (2013.01); H03G 9/005 (2013.01); H03G 9/025 (2013.01); H04R 3/04 (2013.01)

(58) Field of Classification Search
CPC ........ H03G 5/165; H03G 3/301; H03G 9/005; H03G 9/025; H04R 3/04
USPC .......................................... 381/107, 106, 57
See application file for complete search history.

(56) References Cited

U.S. PATENT DOCUMENTS

| | | | |
|---|---|---|---|
| 5,434,922 A | * | 7/1995 | Miller .................... H03G 3/32 381/108 |
| 5,528,695 A | | 6/1996 | Klippel |
| 6,201,873 B1 | | 3/2001 | Dal Farra |
| 8,983,092 B2 | | 3/2015 | Thormundsson et al. |
| 2004/0184627 A1 | | 9/2004 | Kost et al. |
| 2005/0129257 A1 | | 6/2005 | Tamura |
| 2005/0207584 A1 | | 9/2005 | Bright |
| 2006/0153403 A1 | | 7/2006 | Lechner |
| 2009/0304190 A1 | | 12/2009 | Seefeldt et al. |
| 2011/0009987 A1 | * | 1/2011 | Seefeldt ................ H03G 7/007 700/94 |

(Continued)

FOREIGN PATENT DOCUMENTS

| | | |
|---|---|---|
| EP | 1135002 A2 | 9/2001 |
| EP | 1 251 715 | 10/2002 |

(Continued)

OTHER PUBLICATIONS

Extended European Search Report for application EP15166123.8 (Nov. 4, 2015).

(Continued)

*Primary Examiner* — Vivian C Chin
*Assistant Examiner* — Douglas J Suthers

(57) ABSTRACT

A gain function controller may be configured to: receive a first plurality of sub-band-signals; determine a frequency-domain-gain-function for a second plurality of sub-band-signals, based on: the first plurality of sub-band-signals; a power of a first full-band signal; and a predetermined compression curve; and apply the frequency-domain-gain-function to the second plurality of sub-band-signals to provide a frequency-domain-output-signal.

8 Claims, 4 Drawing Sheets

(56) References Cited

U.S. PATENT DOCUMENTS

| | | | |
|---|---|---|---|
| 2012/0106750 A1* | 5/2012 | Thormundsson | H04R 3/007 381/71.12 |
| 2012/0177226 A1 | 7/2012 | Silverstein et al. | |
| 2012/0243706 A1 | 9/2012 | Sandgren | |
| 2012/0328117 A1 | 12/2012 | Gautama | |
| 2013/0022208 A1 | 1/2013 | Dhuyvetter | |
| 2013/0046546 A1 | 2/2013 | Uhle et al. | |
| 2013/0144615 A1* | 6/2013 | Rauhala | G10L 25/69 704/225 |
| 2013/0343584 A1 | 12/2013 | Bennett et al. | |
| 2014/0363006 A1 | 12/2014 | Cherigui | |
| 2016/0322949 A1 | 11/2016 | Gautama | |
| 2017/0150259 A1 | 5/2017 | Gautama | |

FOREIGN PATENT DOCUMENTS

| | | |
|---|---|---|
| EP | 2369852 A1 | 9/2011 |
| EP | 1 542 359 A1 | 6/2015 |
| WO | 0065872 A1 | 11/2000 |
| WO | 0103466 A2 | 1/2001 |
| WO | WO-2008/057173 A1 | 5/2008 |
| WO | WO-2011/019339 A1 | 2/2011 |
| WO | WO-2013/189938 A1 | 12/2013 |

OTHER PUBLICATIONS

Lee, Kyungsoo et al; "High-Level Power Management of Audio Power Amplifiers for Portable Multimedia Applications"; IEEE/ACM/IFIP Workshop on Embedded Systems for Real Time; pp. 41-46 (2006).

Sturtzer, E. et al; "Comparison between voltage and current driving methods of a micro-speaker"; Applied Acoustics, Elsevier, 22 pages (2012).

Extended European Search Report for Patent Appln. No. 15195853.5 (Apr. 21, 2016).

Final Office Action; U.S. Appl. No. 15/359,358 13 pages (Jul. 3, 2018).

Final Office Action; U.S. Appl. No. 15/359,358 14 pages (dated Oct. 10, 2017).

Non Final Office Action; U.S. Appl. No. 15/359,358 12 pages (dated Jun. 23, 2017).

Non-Final Office Action; U.S. Appl. No. 15/359,358 13 pages (dated Jun. 3, 2019).

* cited by examiner

FREQUENCY-DOMAIN DYNAMIC RANGE CONTROL OF SIGNALS

CROSS-REFERENCE TO RELATED APPLICATIONS

This application claims the priority under 35 U.S.C. § 119 of European patent application no. 15166123.8, filed May 1, 2015 the contents of which are incorporated by reference herein.

The present disclosure relates to a gain function controller configured to determine a variable gain for a plurality of sub-band signals, which can be used to drive a loudspeaker for example.

According to a first aspect of the present disclosure there is provided a gain function controller configured to: receive a first plurality of sub-band-signals; determine a frequency-domain-gain-function for a second plurality of sub-band-signals, based on: the first plurality of sub-band-signals; a power of a first full-band signal; and a predetermined compression curve; and apply the frequency-domain-gain-function to the second plurality of sub-band-signals to provide a frequency-domain-output-signal.

Determining the frequency-domain-gain-function based on each of the first plurality of sub-band-signals together with the power of the first full-band signal enables superior control of the dynamic range of the frequency-domain-output-signal.

In one or more embodiments the first plurality of sub-band-signals may correspond to the second plurality of sub-band-signals.

In one or more embodiments the gain function controller may further comprise a first-sub-band-signal-level block configured to determine a first plurality of sub-band-power-signals based on a power level of each of the first plurality of sub-band-signals, wherein the gain function controller may be configured to determine the frequency-domain-gain-function based on the first plurality of sub-band-power-signals.

In one or more embodiments the gain function controller may be further configured to determine the power of the first full band signal based on the first plurality of sub-band-signals.

In one or more embodiments the second plurality of sub-band-signals may be based on the first full-band signal.

In one or more embodiments the second plurality of sub-band-signals may correspond to a plurality of frequency bands of the first full-band signal.

In one or more embodiments the first plurality of sub-band signals may be based on the first full-band signal and the second plurality of sub-band signals may be based on a second full-band signal.

In one or more embodiments the gain function controller may further comprise a second level block configured to determine a power level of the second full-band signal, wherein the gain function controller may be further configured to determine the frequency-domain-gain-function based on the power level of the second full-band signal.

In one or more embodiments the gain function controller may further comprise a third level block configured to determine a second plurality of sub-band-power-signals based on a power level of each of the second plurality of sub-band-signals, wherein the gain function controller may be further configured to determine the frequency-domain-gain-function based on the second plurality of sub-band-power-signals.

In one or more embodiments the gain function controller may further comprise a filter block configured to determine the first full-band signal by filtering the second full-band signal.

In one or more embodiments the filter block may comprise a model of a loudspeaker.

In one or more embodiments the first plurality of sub-band signals may comprise a first plurality of frequency bands of the first full-band signal, the second plurality of sub-band signals may comprise a second plurality of frequency bands of the second full-band signal and the first plurality of frequency bands may correspond to the second plurality of frequency bands.

In one or more embodiments the gain function controller may be configured to determine the frequency-domain-gain-function based on one or more pluralities of further-sub-band-signals derived from one or more further-full-band-signals, and optionally a power of each of the one or more further-full-band signals and/or a plurality of power levels of the one or more further-sub-band signals.

In one or more embodiments the gain function controller may be configured to determine the frequency-domain-gain-function such that the frequency-domain-output-signal, when coupled to a loudspeaker, drives the loudspeaker within a pre-determined displacement limit.

In one or more embodiments an integrated circuit or an electronic device may comprise the gain function controller.

In one or more embodiments the first full-band signal may be a noise signal.

In one or more embodiments the first plurality of sub-band signals may be based on a Fast Fourier Transform of the first full-band signal.

In one or more embodiments the second plurality of sub-band signals may be based on a Fast Fourier Transform of the second full-band signal.

According to a second aspect of the present disclosure there is provided a method for operating a gain function controller, comprising: receiving a first plurality of sub-band-signals; determining a frequency-domain-gain-function for a second plurality of sub-band-signals, based on: the first plurality of sub-band-signals; a power of a first full-band signal; and a predetermined compression curve; and applying the frequency-domain-gain-function to the second plurality of sub-band-signals to provide a frequency-domain-output-signal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One of more embodiments will now be described by way of example only with reference to the accompanying drawings in which.

Figure 1:
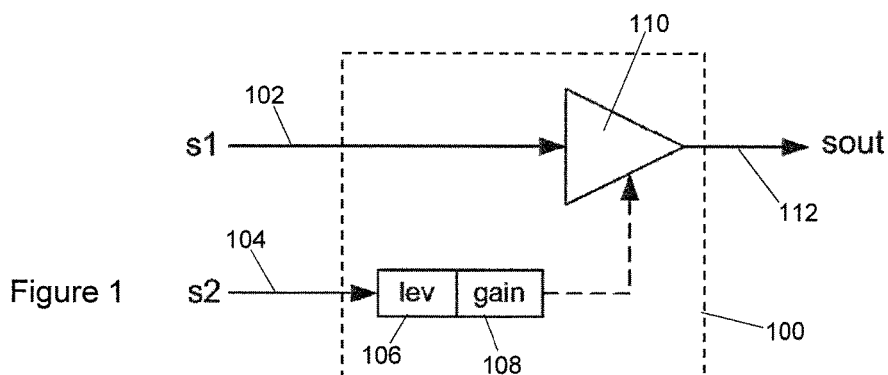
FIG. 1 shows an example embodiment of a variable gain signal processor.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

DETAILED DESCRIPTION

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

A loudspeaker may have a maximum safe displacement beyond which damage may occur to the loudspeaker. Audio devices configured to drive loudspeakers may therefore comprise a loudspeaker protection system designed to avoid supplying any signal that would drive the loudspeaker beyond its maximum safe displacement. The present disclosure relates to means by which signals for loudspeakers may be processed to protect a loudspeakers from damage while maintaining advantageous audio performance.

FIG. 1 shows an example side-chain dynamic range compression module 100. A side-chain dynamic range compression (SCDRC) module is configured to reduce the dynamic range of audio signals, that is, it decreases the difference between high and low amplitudes of a primary input signal 102. A side-chain dynamic range compression module is an example of a gain function controller. The SCDRC module includes a variable gain amplifier 110, a level block 106 ("lev"), and a gain block 108 ("gain"). The variable gain amplifier 110 applies an adaptive gain value to a primary input signal 102 to generate an output signal 112, which may subsequently be coupled, directly or indirectly, to a loudspeaker (not shown) in order to generate an acoustic signal. The level of a secondary input signal 104 (power or amplitude) is determined by the level block 106 ("ev") and an adaptive gain value is determined, on the basis of a compression curve, by the gain block 108 ("gain"). A compression curve defines the relationship between the input level 106 and the target output level of the secondary signal. In this way, the SCDRC module 100 applies an adaptive gain value to the primary input signal 102, wherein the adaptive gain value is determined in accordance with the level of the secondary input signal 104 and a function defined by the compression curve 200. A dynamic range compression module (DRC) is a SCDRC module where the primary and secondary signal are identical.

In this way, the adaptive gain value can be determined using the signal level of a secondary signal 104, $s_2$, which can be referred to as the side-chain signal. Such a side-chain dynamic range control (SCDRC) controls the gain that is applied to the primary signal 102, $s_1$, on the basis of the dynamics of the secondary signal 104, $s_2$, following a certain compression curve.

Figure 2:
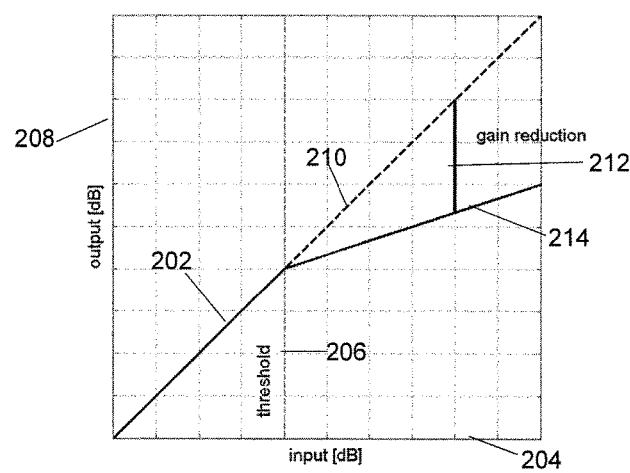
FIG. 2 shows an example embodiment of a compression curve.

An example of a compression curve 200 is shown in FIG. 2. The input/output level relationship 202 is such that it reduces the output signal level 208 by a certain amount if the input signal level 204 exceeds a compression threshold 206 (dashed vertical line). In the absence of compression, the output signal level 208 would be equal to the input signal level 204, which is represented by the dashed diagonal line 210. The gain reduction 212 is the difference between this dashed line 210 and the solid curve 214. The signal level is computed as an asymmetrically smoothed version of the signal power or amplitude, which has an 'attack' time constant (used when the signal level increases) and a 'release' time constant (used when the signal level decreases). The gain reduction is computed from the compression curve 200 and is traditionally expressed as a compression ratio (for example, a compression ratio of 3:1 means that if the input signal level exceeds the compression threshold by 3 dB, the output signal level will exceed it by 1 dB). Other compression curves are possible, for example, curves with 'soft knees' that do not have a discontinuity in the curve at the compression threshold 206, or curves with several knees (and therefore, several thresholds). A special case of a DRC is a limiter, which limits the signal level to a certain value. It can be obtained by setting the compression ratio to a high value, for example, to 50. If the compression ratio is infinitely large, and the attack and release time constants are set to zero, a hard limiter is obtained.

Returning to FIG. 1, the side-chain DRC module computes a gain value as a function of the signal level (amplitude or energy) of the secondary signal 104. The root-mean-square (RMS) of the signal samples is an example measure of signal level.

$$GSCDRC\ (RMSin2) = \frac{RMSout2}{RMSin2}, \qquad (1)$$

where RMSout2 is the target signal energy of the output signal and is determined from a compression curve. The signal levels and gain value can be temporally smoothed, possibly with asymmetrical time constants. The adaptive gain GSCDRC is applied to the primary input signal to obtain the output signal:

$$sout1(t) = GSCDRC(RMSin2) \cdot s_1(t) \qquad (2)$$

The side-chain DRC determines the adaptive gain based only on the secondary signal 104 in this example, and not on the primary signal 102. As a result, the signal level of the output signal is solely determined by the dynamics of the secondary input signal.

In some examples, the DRC module 100 of FIG. 1 may be configured to receive the primary signal 102 as a secondary signal 104 for calculating the gain value. That is, the secondary signal 104 is the same as the primary signal 102. The DRC module may thus be configured to compute an adaptive gain value as a function of the signal level (amplitude or energy) of the primary input signal 102. The adaptive gain value can be determined as:

$$GDRC\ (RMSin1) = \frac{RMSout1}{RMSin1}, \qquad (3)$$

where RMSin1 is the known primary input signal level, RMSout1 is the target signal energy of the output signal, which is determined from a compression curve (see, for example, FIG. 2). The signal levels and gain value can be temporally smoothed, possibly with asymmetrical time constants. The adaptive gain GDRC is applied to the primary input signal to obtain the output signal:

$$sout1(t) = GDRC(RMSin1) \cdot s_1(t) \qquad (4)$$

Mechanical loudspeaker protection can be implemented with this type of SCDRC. The objective is to limit the diaphragm displacement to a certain maximal displacement, xlim.

For this purpose, the diaphragm displacement that is caused by the primary signal is predicted, for example, using a loudspeaker model, and is used as secondary signal in a SCDRC, which is configured as a limiter (very fast time constants and very large or even infinite compression ratio). In this way, the adaptive gain that is applied to the primary signal is controlled in such a way that when the gain would be applied to the secondary signal, the level of the output signal would not exceed the threshold value which is set to xlim. The result is that, by limiting the secondary signal, the diaphragm displacement predicted for the output signal is approximately limited to xlim.

An extension of the DRC module is a multi-band DRC module. A primary signal, $s_1$, is divided into sub-band signals by an analysis filterbank ("ana"). The signal level (amplitude or energy) is determined for each of the sub-band signals (sbn), and for each of the sub-band signals separately, a gain value is computed on the basis of the sub-band signal levels and a compression curve. The gain values are applied to the corresponding sub-band signals and these signals are fed into a synthesis filterbank ("syn"), which computes an output signal, sout. Separate DRC modules for each sub-band can have the same or different parameters, and they may have a side-chain signal. In the case of a side-chain signal, the secondary signal can be the same across all of the DRC modules, or it can be a sub-band signal obtained by applying the analysis filterbank to the side-chain signal.

The multiband DRC module processes each sub-band separately, without taking into account the signal levels of the other sub-band signals. As a result, the signal level at the output is not linked to the input signal level in a straightforward manner.

The present disclosure provides a method to perform dynamic range control. A multiband or frequency-domain method can be used to adjust a gain function (a gain value for each frequency component or sub-band signal) such that an output signal level follows a certain relationship to the input signal level, whilst jointly controlling the different sub-bands (as opposed to independently controlling them). The method can use a secondary signal as side-chain input, and the gain function may take into account both primary and secondary input, rather than being solely determined from the secondary input.

Figure 3:
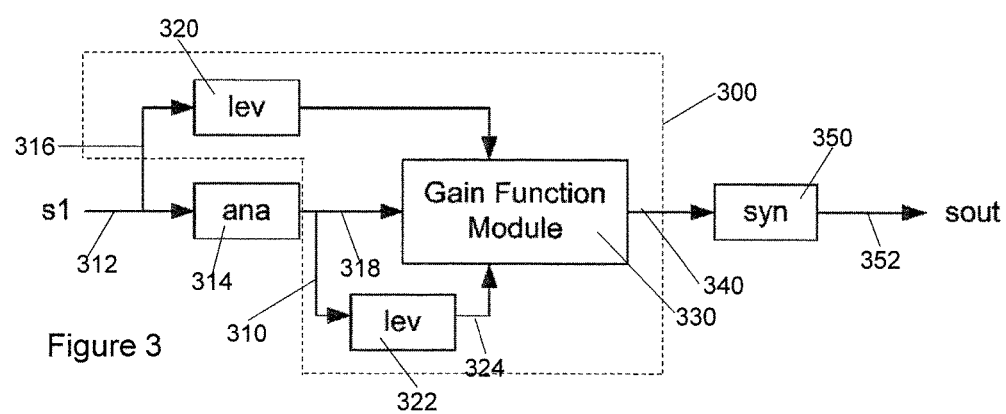
FIG. 3 shows an example embodiment of a gain function controller configured to receive a first full-band signal.
Figure 4:
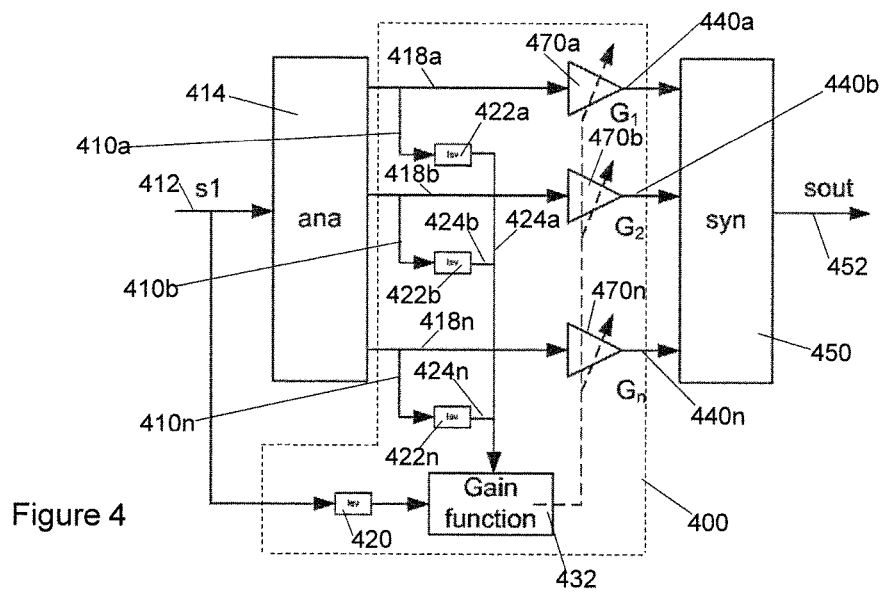
FIG. 4 shows the gain function controller of FIG. 3 in greater detail.

FIG. 3 shows an example gain function controller 300. FIG. 4 shows the gain function controller of FIG. 3 in greater detail. The gain function controller 300 is configured to receive a first plurality of sub-band-signals 310 in the frequency domain. Sub-band signals are described here as frequency-domain representations, and no difference will be made between a sub-band domain and a frequency-domain representation, unless stated explicitly. The first plurality of sub-band signals 310 is derived from a primary signal 312, which is a time domain signal, by conversion of the primary signal 312 to the frequency domain by a time-to-frequency-conversion-block (ana) 314. The time-to-frequency-conversion-block 314 is not part of the gain function controller 300 in this example, although it will be appreciated that in other examples the time-to-frequency-conversion-block 314 may be provided as part of a gain function controller.

The gain function controller 300 is configured to receive a first full-band signal 316, which in this example is the same as the primary signal 312 from which the first plurality of sub-band signals 310 are derived. The gain function controller 300 comprises a full-band-signal-level-block 320 configured to determine a power of the first full-band signal 316. The gain function controller 300 is also configured to receive a second plurality of sub-band-signals 318, which in this example corresponds to, and is the same as, the first plurality of sub-band-signals 310. In this example the second plurality of sub-band-signals 318 is thereby based on the first full-band signal 316. The second plurality of sub-band-signals 318 may correspond to a plurality of frequency bands of the first full-band signal. In other examples, the second plurality of sub-band signals may comprise signals resulting from a Fast Fourier Transform being applied to the first full-band signal 316.

The gain function controller 300 is configured to determine a frequency-domain-gain-function for the second plurality of sub-band-signals 318, based on: (i) the first plurality of sub-band-signals 310; (ii) the power of the first full-band signal 316, as determined by the full-band-signal-level-block 320 in this example; and (iii) a predetermined compression curve. Such a frequency-domain-gain-function can be beneficial because it can account for variations in the signal at different sub-bands (based on the first plurality of sub-band-signals 310) and also the overall power of a full-band signal (based on first full-band signal 316). As will be discussed below, in this way a better output signal can be provided because its power can be well controlled, whilst still allowing variations for different properties of different sub-bands.

In this example, the gain function controller 300 also comprises a first-sub-band-signal-level block 322 configured to receive the first plurality of sub-band signals 310 and to determine a first plurality of sub-band-power-signals 324 based on the power or amplitude of each of the first plurality of sub-band-signals 310. The first plurality of sub-band-power-signals 324 is provided to a gain function module 330 which is configured to determine the frequency-domain-gain-function in accordance with the first plurality of sub-band-power signals 324. In some examples, the power of the first full-band signal may be determined based on the first plurality of sub-band-signals, because the first plurality of sub-band signals is itself based on the first full-band signal. In other examples the power of the first full-band signal may be determined directly from the first full-band signal.

It will be appreciated that determining the frequency-domain-gain-function in accordance with the sub-band power signals 324 falls within the scope of determining the frequency-domain-gain-function based on the first plurality of sub-band-signals 310 because the sub-band power signals 324 are derived from the first plurality of sub-band-signals 310.

Having determined the required frequency-domain-gain-function, the gain function module 330 is configured to apply the frequency-domain-gain-function to the second plurality of sub-band signals 318 to provide a frequency-domain-output-signal 340. The frequency-domain-gain-function may thereby provide a different gain for each of the second plurality of sub-band signals 318.

The frequency-domain-output-signal 340 is provided to a frequency-to-time-conversion-block 350 in this example, which is configured to convert the frequency-domain-output-signal 340 into a time-domain-output-signal 352. It will be appreciated that, while the frequency-to-time-conversion-block 350 is not part of the gain function controller 300 in this example, in other examples a frequency-to-time-conversion-block may be integrated into a gain function controller. Subsequently, the time-domain-output-signal 352 may be provided to a loudspeaker (not shown) in order to generate an acoustic output. FIG. 4 shows a more detailed illustration of an example gain function controller 400 similar to that of FIG. 3. Features of FIG. 4 that are similar to features of FIG. 3 have been given similar reference numerals and may not necessarily be discussed further here.

A time-to-frequency-conversion-block 414 provides a first plurality of sub-band signals 410*a*, 410*b*, 410*n* based on a first full-band signal 412. Some representative sub-band signals of the first plurality of sub-band signals are shown in FIG. 4. For example, a first sub-band signal 410*a* is provided by the time-to-frequency-conversion-block 414 to a first sub-band signal level block 422*a*, which determines the power of the first sub-band signal and generates a first-sub-band power signal 424*a* which is provided to a gain function block 432. The second plurality of sub-band signals 418*a*, 418*b*, 418*n* is also provided by the time-to-frequency conversion block 414. In this example the second plurality of sub-band signals 418*a*, 418*b*, 418*n* is the same as the first plurality of sub-band signals 410*a*, 410*b*, 410*n*. Thus a first signal 410*a* of the second plurality of sub-band signals is the same as the first signal 418*a* of the first plurality of sub-band signals.

The gain function block 432 comprises a sub-set of the functionality of the gain function module shown in FIG. 3. The gain function block 432 is configured to determine the gain function, but not to provide a frequency-domain-output-signal. Rather, frequency-domain-output-sub-signals 440*a*, 440*b*, 440*n* are provided by variable gain amplifiers 470*a*, 470*b*, 470*n* that are connected to, and configured by, the gain function block 432, as disclosed in greater detail below.

Each individual signal of the first plurality of sub-band signals 410*a*, 410*b*, 410*n* is provided and processed in the same way as the first sub-band signal 410*a*. A power or amplitude of each individual signal of the first plurality of sub-band signals 410*a*, 410*b*, 410*n* is thus determined and provided to the gain function block 432. The gain function block 432 is thereby configured to provide for the frequency-domain-gain-function based on: (i) the first plurality of sub-band power signals 410*a*, 410*b*, 410*n*, (ii) a power or amplitude of the first full-band signal 412, and (iii) a predetermined compression curve.

Each individual signal of the second plurality of sub-band signals 418*a*, 418*b*, 418*n* is provided to a respective variable gain amplifier 470*a*, 470*b*, 470*n*. For example, the first signal of the second plurality of sub-band signals 418*a* is provided to a first variable gain amplifier 470*a*. Information representative of the frequency-domain-gain-function is provided to each variable gain amplifier 470*a*, 470*b*, 470*n* by the gain function block 432. Thereby, the first variable gain amplifier 470*a* receives a first gain factor which it applies to the first signal of the second plurality of sub-band signals 418*a* to generate a first-frequency-domain-output-sub-signal 440*a*. Each of the other sub-band signals of the second plurality of sub-band signals 418*a*, 418*b*, 418*n* is similarly supplied to a respective variable gain amplifier 470*a*, 470*b*, 470*n*, each of which is configured in accordance with the frequency-domain-gain-function to provide a respective gain factor to generate a corresponding frequency-domain-output-sub-signal 440*a*, 440*b*, 440*n*. The frequency-domain-output-sub-signals 440*a*, 440*b*, 440*n* are provided to a frequency-to-time-conversion-block 450 that provides a time-domain-output signal 452, which can be suitable for coupling directly or indirectly to a loudspeaker. In this way, the gain function controller 400 provides a variable gain to each signal within the second plurality of sub-band signals 418*a*, 418*b*, 418*n* that depends on the power of each signal within the first plurality of sub-band signals 410*a*, 410*b*, 410*n*.

It will be appreciated that in some examples any gain function controller disclosed herein may be embodied in software or any system for hosting instructions for enabling a gain function controller. Such a system may have an input/output data interface with an electronic apparatus. The electronic apparatus may include a processor, a storage device, and a non-transient machine-readable storage medium. The machine-readable storage medium may include instructions which control how the processor receives input data and transforms the input data into output data, using data within the storage device. Example instructions stored in the machine-readable storage medium are discussed elsewhere in this specification. The machine-readable storage medium in an alternate example embodiment is a non-transient computer-readable storage medium.

In the example of FIG. 4 an input primary signal, $s_1$ 412, is fed into an analysis filterbank ("ana") 414, yielding sub-band signals (sbn, where n is a number). The signal level (amplitude or energy) is determined for each of the sub-band signals ("lev" 422a, 422b, 422n), and for the primary signal, $s_1$. Using the estimated levels, a gain function (that is, a gain value, G., for each of the sub-bands) is determined, and it is applied to the sub-band signals. The signals are fed into a synthesis filterbank ("syn") 450, which computes an output signal, sout 452. The application of the gain function to the sub-band signals may be incorporated into the "syn" module 450. In this way, the gain function takes into account the input signal level and the levels of the sub-band signals, and jointly calculates/optimises the gain values to obtain the desired output signal level. This is in contrast to systems that compute the gain value for a sub-band signal solely on the basis of the signal level of that sub-band signal, thus processing each sub-band signal independently from the others, in which case the signal levels of the sub-bands reach the desired level, but the output signal level as a whole may not.

The level of the primary input signal, $s_1$, is computed in an "lev" module 420, which is an example of a full-band-signal-level-block, and the levels of the sub-band signals are computed in a "lev" module 422(a-n), which are examples of first-sub-band-signal-level blocks (one level for each sub-band). In some examples, the power of the full-band signal can be determined based on the first plurality of sub-band-signals. The computation of the gain function is performed in the "Gain Function Block" 432. The analysis 414 ("ana") and synthesis 450 ("syn") filterbanks convert a signal to the sub-band-domain and vice versa. These modules can also represent a Fast Fourier Transform (FFT) and its inverse. In that case (a frequency-domain approach), the "ana" module 414 transforms a time frame of N audio samples of the signal, $s_1$, into N frequency components, $S_1(\omega)$, with $\omega$ denoting frequency. The "syn" module 450 transforms the frequency components back to the time domain. Other functions that may be performed for frequency-based processing (for example, windowing and overlap-add) can be included in the "ana" 414 and "syn" 450 modules. In the remainder of the text, both a frequency component of an FFT or a sub-band signal will be represented as $S(\omega)$, where $\omega$ either denotes a frequency or should be interpreted as an index of a sub-band. The signal level is denoted by $|S(\omega)|$.

The frequency-domain gain function that is determined by any gain function module described herein may be used in applications of noise suppression. In such applications, the frequency spectrum of the noisy signal, $Y(\omega)$, is multiplied by a gain function, $G(\omega)$, which is computed such that an estimated noise or interference amplitude spectrum, $|N(\omega)|$, is subtracted to obtain the 'clean' signal $X(\omega)$:

$$X(\omega)=Y(\omega)\cdot G(\omega), \quad (5)$$

where $X(\omega)$ and $Y(\omega)$ are complex-valued frequency components and $G(\omega)$ is a real-valued gain function. The gain function is computed for each time frame, and the output is constructed using well-known methods (such as windowing and overlap-add). There exist several gain functions, an example of which is:

$$G(\omega) = \frac{|Y(\omega)| - \gamma_s|N(\omega)|}{|Y(\omega)|}, \quad (6)$$

where $\gamma_s$ is a spectral (over-) subtraction factor. Typically, the gain value is limited to an upper (for example, 1) and lower value (for example, 0).

In the present method, a (frequency- or sub-band-domain) gain function, $G(\omega)$ is used that is derived from the amplitude spectrum or the sub-band signal levels of the primary signal. One example is:

$$G(\omega) = 1 - \gamma_s \frac{|S_1(\omega)|}{\sum |S_1(\omega)|}, \quad (7)$$

where $\gamma_s$ is an adaptive spectral subtraction factor (identical for all frequencies or sub-bands) that needs to be determined. The gain function will be low (much attenuation) when $S_1(\omega)$ is a frequency component or sub-band signal that contains a lot of the total signal energy. Other gain functions are possible, and the present disclosure is not limited to this particular gain function. To implement a multiband (frequency- or sub-band-domain) dynamic range controller with joint sub-band control, the appropriate value for the adaptive spectral subtraction factor, $v_s$, can be computed such that a certain target output power, which can be determined from the primary input power and a compression curve (such as that shown in FIG. 2), is obtained. Following Parceval's theorem, the total signal energy is equal to the sum of the energies per frequency (or approximately equal for the sub-band case). Therefore, input/output ratio, $R_1^2$, of the primary signal can be expressed as:

$$R_1^2 = \frac{\sum |S_1(\omega)|^2}{\sum |Sout1(\omega)|^2} \quad (8)$$

$$= \frac{\sum |S_1(\omega)|^2}{\sum |S_1(\omega) \cdot G(\omega)|^2} \quad (9)$$

The adaptive spectral subtraction factor of the gain function, $\gamma_s$, can be determined from the power ratio by combining equations (7) and (9) and solving for $\gamma_s$ (the power ratio is known from the input signal level and the compression curve). This way, the adaptive spectral subtraction factor, $\gamma_s$, and subsequently, the gain function, $G(\omega)$, can be computed. The output is obtained by applying the gain function to the input signal:

$$Sout1(\omega)=S_1(\omega)\cdot G(\omega) \quad (10)$$

and processing it with the synthesis module.

Figure 5:
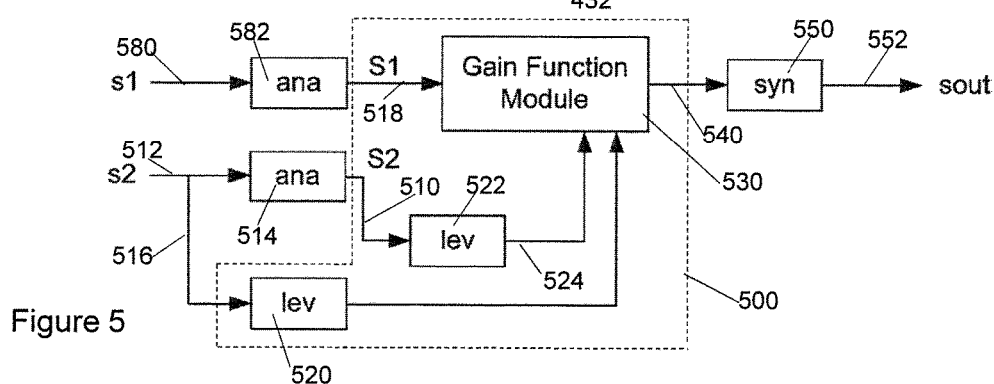
FIG. 5 shows an example embodiment of a gain function controller configured to receive a first full-band signal and a second full-band signal.

FIG. 5 shows an example gain function controller 500 configured to receive a first plurality of sub-band signals 510, based on a first full-band signal 512, and to receive a second plurality of sub-band signals 518, based on a second full-band signal 580. The first full-band signal 512 is different to the second full-band signal 580 in this example. The second plurality of sub-band signals 518 is generated by a second-time-to-frequency-converter block 582 in this example. The second full-band signal 580 is the signal to be provided to a loudspeaker, once it has been processed by the gain function controller 500. The first full-band signal 512, which may be an example of a sidechain signal, together with a predetermined compression curve, is used to determine the frequency-domain-gain-function. Features of FIG. 5 that are similar to features of FIG. 3 have been given similar reference numerals and will not necessarily be discussed further here. For example, the gain function controller includes a full-band-signal-level-block 520 and a sub-band signal level block 522.

The gain function controller 500 determines the frequency-domain-gain-function based on the first plurality of sub-band signals 510, a power of the first full-band signal 516 and a first plurality of sub-band-power signals 524 determined based on the power or amplitude of each of the first plurality of sub-band signals 510. In some examples, the first full-band signal may be a measured or an estimated noise signal. In such cases, the frequency-domain-gain-function may be configured to reduce unwanted noise in the second full-band signal. In some examples, the power of the first full-band signal is input to gain function controller 500.

In some examples, the gain function controller 500 may further comprise a second level block (not shown) configured to determine a power level, or an amplitude level, of the second full-band signal 580. The gain function controller 500 in such an example can determine the frequency-domain-gain-function also based on the power level of the second full-band signal 580.

In some examples, the gain function controller 500 may further comprise a third level block (not shown) configured to determine a second plurality of sub-band-power-signals based on a power level of each of the second plurality of sub-band-signals 518. The gain function controller 500 in such an example can determine the frequency-domain-gain-function also based on the second plurality of sub-band-power-signals.

In some examples the first plurality of sub-band signals 510 may comprise a first plurality of frequency bands of the first full-band signal 512. The second plurality of sub-band signals 518 may comprise a second plurality of frequency bands of the second full-band signal 580. In such examples, the first plurality of frequency bands may correspond to the second plurality of frequency bands. Indeed, the first plurality of frequency bands may be the same as the second plurality of frequency bands.

In some examples, the gain function controller 500 may be a side-chain controller configured to receive a primary signal $s_1$ 580 and a secondary signal $s_2$ 512. Both the primary and secondary signals are transformed into sub-band signals 518, 510 using analysis filterbanks ("ana") 582, 514. The signal level (amplitude or energy) of the primary 580 and/or secondary signal 512 and of the primary and/or secondary sub-band signals 518, 510 are fed into the gain function module 530. A gain function is computed and applied to the primary sub-band signals 518. The resulting frequency domain output signals 540 are fed into the synthesis filterbank ("synth") 550, which computes the time domain output signal 552. The "Gain Function module" computes a gain function, which consists of a gain value for each sub-band, taking into account all secondary sub-band signal levels 524. The gain function is applied to the primary sub-band signals 518.

In some examples, a (frequency- or sub-band-domain) gain function, $G(\omega)$, is used that is derived from the amplitude spectrum or the sub-band signal levels of the secondary input signal. One example is:

$$G(\omega) = 1 - \gamma_s \frac{|S_2(\omega)|}{\sum |S_2(\omega)|}, \tag{11}$$

where $\gamma_s$ is an adaptive spectral subtraction factor (identical for all frequencies or sub-bands) that needs to be determined. The gain function will be low (much attenuation) when $S_2(\omega)$ is a frequency component or sub-band signal that contains a lot of the total signal energy. Other gain functions are possible, possibly including $S_1(\omega)$ as well, and the proposed method is not limited to this particular gain function. To implement a multiband (frequency- or sub-band-domain) side-chain dynamic range controller with joint sub-band control, the appropriate value for the adaptive spectral subtraction factor, $\gamma_s$, is computed such that a certain target output power, which can be determined from the primary or secondary input power and a compression curve is obtained. Note that this is different from SCDRC systems that only consider the secondary signal. The input/output ratio, $R_{1,2}^2$, of the primary and secondary signal can be expressed as:

$$R_{1,2}^2 = \frac{\sum |S_{1,2}(\omega)|^2}{\sum |Sout1(\omega)|^2} \tag{12}$$

$$= \frac{\sum |S_{1,2}(\omega)|^2}{\sum |S_{1,2}(\omega) \cdot G(\omega)|^2} \tag{13}$$

The adaptive spectral subtraction factor of the gain function, $\gamma_s$, can be determined from at least one of the power ratios by solving for $\gamma_s$ (the power ratio is known from the input signal level and the compression curve). In this way, the adaptive spectral subtraction factor, $\gamma_s$, and subsequently, the gain function, $G(\omega)$, can be computed.

The output is obtained by applying the gain function to the primary input signal:

$$Sout1(\omega) = S_1(\omega) \cdot G(\omega) \tag{14}$$

and processing it with the synthesis module.

The proposed method has the option to derive the spectral subtraction factor based on at least the secondary signal 582, but can also use the primary signal 580 (level and sub-band signal levels).

If the secondary power ratio, $R_2^2$ is used, the proposed method controls the signal level of the primary signal 580 on the basis of the dynamics of the secondary signal 512. In some examples, a gain function is used in the proposed method, rather than a gain value in the SCDRC. Furthermore, the gain function is determined to jointly control the different sub-bands to reach a certain target output signal level.

If the primary power ratio, $R_1^2$, is used, the signal level of the primary signal 580 is controlled directly, while the gain function still uses information from the secondary signal 512. This is different from an SCDRC for which the gain value can only be derived from the signal level of the secondary signal 512 (if that of the primary signal 580 is used, the secondary signal 512 is not used at all, and a DRC without side-chain is obtained).

Figure 6:
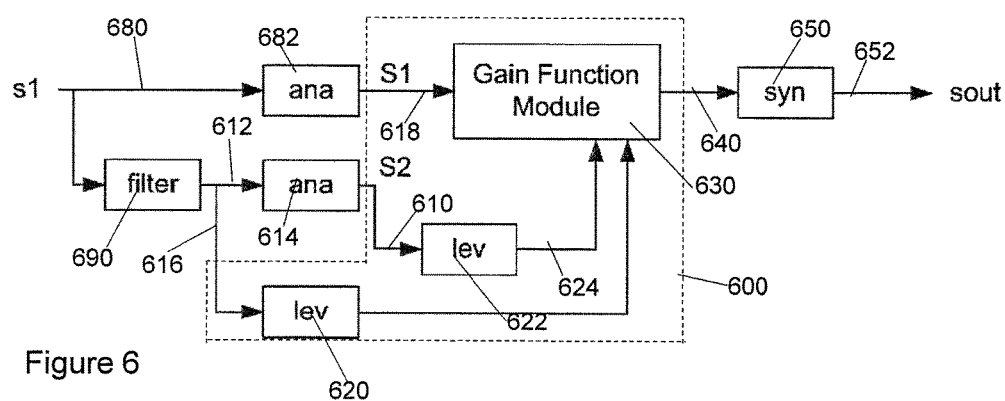
FIG. 6 shows an example embodiment of a gain function controller in which the first full-band signal is provided by filtering the second full-band signal.

FIG. 6 shows an example gain function controller 600 similar to the gain function controller of FIG. 5. Features of FIG. 6 that are similar to features of FIG. 5 have been given similar reference numerals and will not necessarily be discussed further here. For example, the gain function controller includes a full-band-signal-level-block 620, a sub-band signal level block 622, and a gain function module 630. The gain function controller interacts with analysis filterbanks ("ana") 614, 682, and a synthesis filterbank ("synth") 650. A first plurality of sub-band signals 610 and a first full-band signal 616 are input into the gain function controller 600. A first plurality of sub-band-power signals 624 is input into the gain function module.

The gain function controller 600 is configured to receive a second plurality of sub-band signals 618 based on a second full-band signal 680. The second full-band signal 680 is also provided to a filter block 690 that provides a first full-band signal 612 by filtering the second full-band signal 680. In this way the first full-band signal 612 is a filtered version of the second full-band signal 680.

Filtering can be applied by the filter block 690 in the frequency or sub-band domain in order to provide good efficiency. The filtering operation can implement a frequency weighting where the weighting is inversely related to the perceptual relevance of the frequency, for example, with respect to the perceived loudness. The filtering operation can also implement a frequency weighting that takes into account perceptual masking effects by boosting the frequency components that are perceptually masked. The boosted frequencies will be more attenuated in the frequency domain output signals 640 signal after application of the gain function.

The filtering operation can also be replaced by a module that outputs the predicted behaviour of a model, for example, the predicted loudspeaker diaphragm displacement. That is, in some examples the filter block 690 may comprise a model of a loudspeaker with its input derived from the second full-band signal 680. The first full-band signal 612 may be configured to provide information to the gain function controller 600 that enables the frequency-domain-gain-function to be determined such that the time-domain-output signal 652 will not drive the modelled loudspeaker beyond acceptable operating parameters, by driving the diaphragm within a pre-determined displacement limit. In this way, the possibility of damaging the loudspeaker may be reduced or avoided whilst maintaining a good quality of audio reproduction. This can be used to provide a loudspeaker protection scheme that limits the excursion (the first full-band signal 612 is the predicted excursion) using one of the proposed embodiments of the method that includes a secondary signal.

A gain function controller according to the present disclosure may thus be advantageously configured to provide for a method for mechanical loudspeaker protection, as the amplitude of the secondary signal (predicted excursion) can be accurately limited, which can benefit from direct control based on the excursion signal as a whole. Conversely, systems that control each sub-band independently are less suited to providing mechanical loudspeaker protection as, while the contribution to the overall excursion provided by each sub-band may be limited, the overall excursion depends on the sum of all sub-band signals which may exceed safe levels.

Figure 7:
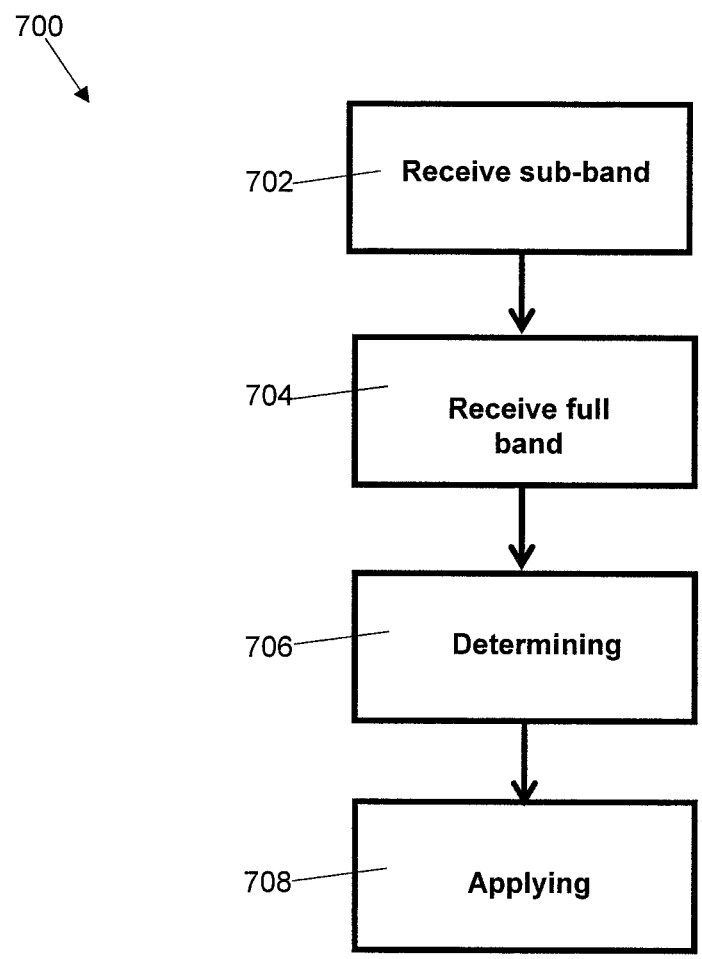
FIG. 7 shows an example embodiment of a flow diagram of an example method of operating a gain function controller.

FIG. 7 shows a flow chart that illustrates an example method 700 of data processing according to the present disclosure. The method 700 may be performed by a gain function controller according to the present disclosure. A first step 702 comprises receiving a first plurality of sub-band-signals in the frequency domain. A second step 704 comprises receiving a first full-band signal. A third step 706 comprises determining a frequency-domain-gain-function for a second plurality of sub-band-signals, based on: the first plurality of sub-band-signals; a power of the first full-band signal (which may in some examples be derived from the first plurality of sub-band-signals); and a predetermined compression curve. A fourth step 708 comprises applying the frequency-domain-gain-function to the second plurality of sub-band-signals to provide a frequency-domain-output-signal. Thereby, the method may enable the advantageous control of the power of the frequency-domain-output-signal so as to provide for, for example, loudspeaker protection or a power-saving mode of operation, while maintaining superior audio reproduction quality.

Figure 8:
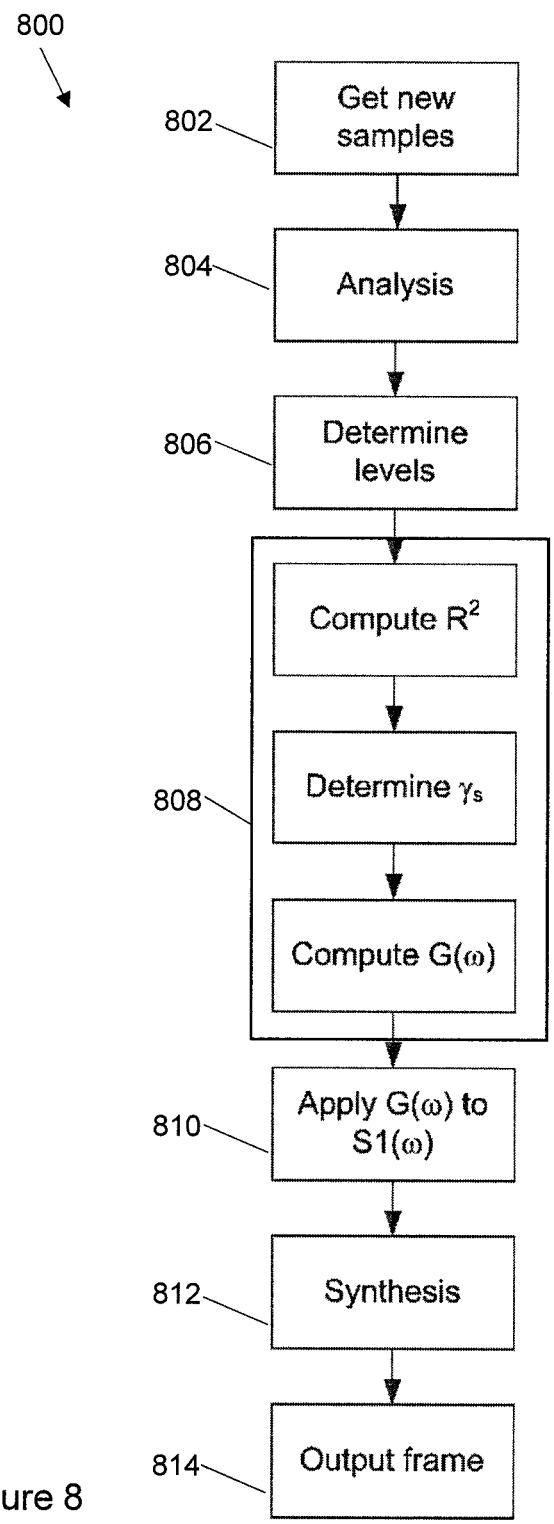
FIG. 8 shows an example embodiment of a flow diagram of an example method of operating a gain function controller.

FIG. 8 shows a flow chart for an example method 800 of data processing according to the present disclosure. At a first step 802 a set or frame of audio samples, that correspond to a first full-band signal, are obtained. At a second step 804 the new frame of audio samples are converted from the time domain to a plurality of sub-band signals in the frequency domain. For each new frame, the second step 804 may comprise FFT processing (and optionally other processing that is required for frequency-based processing, such as windowing and overlap-add buffering). At a third step 806, power levels of the first full-band signal and any relevant sub-band signals are determined. At a fourth step 808, a power ratio is determined (either from a compression curve, or from a desired limiting action), either on the primary or the secondary input signal. The primary spectral subtraction factor, $\gamma_s$, is determined (this is done each frame), and the gain function is computed. At a fifth step 810, the gain function is applied to the frequency-domain representation of the primary input signal, which is a plurality of sub-band signals. At a sixth step 812 the resulting frequency-domain-output-signal is transformed back to the time domain (which may involve performing an inverse FFT; this may also include optional processing such as windowing and overlap-add buffering). Finally, at a seventh step 814, the output frame is available in the form of a time-domain-output-signal that may be coupled, directly or indirectly, to a loudspeaker to provide an acoustic output.

The proposed method can be extended to incorporate multiple secondary signals. These can be external or they can be derived from the primary signal or from one of the other secondary signals. The gain function may incorporate the amplitude spectra or signal levels of multiple secondary signals, or multiple gain functions may be computed, one for each secondary signal, after which the gain functions may be combined (by taking the average, minimum or maximum value for each frequency).

In some examples, a gain function controller may be configured to determine the frequency-domain-gain-function based on one or more pluralities of further-sub-band-signals derived from one or more further-full-band-signals and optionally a power of each of the one or more further-full-band signals and/or a plurality of power levels of the one or more further-sub-band signals.

The method of the present disclosure may be implemented with the following components:
- a module for dividing a signal into sub-bands or frequency components
- a module for computing a gain function to reach a target output signal level (specified by a compression curve)
- a module for applying the gain function to the primary signal
- a module for synthesising the output signal The present disclosure may be used for mechanical loudspeaker protection. Methods that use a side-chain DRC (limiter) can be prone to audio artefacts (such as volume pumping) when a lot of protection is required. The proposed method is frequency selective and can lead to significantly fewer audio artefacts. The proposed method can be used for mobile as well as automotive audio applications.

The proposed method can be used to improve speech intelligibility in mobile phones in the presence of ambient noise. If the ambient noise is used as secondary signal, the noisy frequencies will be attenuated in the primary signal, in favour of the remaining frequencies, which can be boosted.

The present disclosure describes a method to control the dynamics of a signal in the frequency domain. The processing involved can relate to more than a single gain value: the dynamics can be controlled using a frequency- or sub-band-domain gain function. The proposed method computes a gain function that takes into account information from all frequencies.

A gain function controller of the present disclosure may be provided as an integrated circuit. In some examples, a gain function controller of the present disclosure may be integrated into an audio device, such as a mobile phone, smartphone, tablet computer, laptop computer or an in-car audio device.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A gain function controller comprising a processor and non-transitory computer readable medium, the processor configured to:
   receive a first plurality of sub-band-signals that is based on a first full-band signal;
   determine a frequency-domain-gain-function for a second plurality of sub-band-signals that is based on a second full-band signal, wherein the second full-band signal is not based on the first full-band signal, and wherein determining the frequency-domain-gain-function for the second plurality of sub-band-signals comprises determining the frequency-domain-gain-function for the second plurality of sub-band-signals based on:
      the first plurality of sub-band-signals;
      a power of the first full-band signal that does not include a power of the second full-band signal, wherein the first full-band signal is a measured noise signal or an estimated noise signal; and
      a predetermined compression curve;
   apply the frequency-domain-gain-function to the second plurality of sub-band-signals to provide a frequency-domain-output-signal, wherein the processor is further configured to determine the frequency-domain-gain-function to jointly control the second plurality of sub-band-signals based on an adaptive spectral subtraction factor that is identical for all sub-bands such that the frequency-domain-output-signal, when coupled to a loudspeaker, drives the loudspeaker within a pre-determined displacement limit for mechanical loudspeaker protection.

2. The gain function controller of claim 1, wherein the first plurality of sub-band-signals corresponds to the second plurality of sub-band-signals in frequency.

3. The gain function controller of claim 1, wherein the processor is further configured to determine a first plurality of sub-band-power-signals based on a power level of each of the first plurality of sub-band-signals and to determine the frequency-domain-gain-function based on the first plurality of sub-band-power-signals.

4. The gain function controller of claim 1, wherein the second plurality of sub-band-signals corresponds to a plurality of frequency bands of the first full-band signal.

5. The gain function controller of claim 1, wherein the processor is further configured to generate a model of a loudspeaker.

6. The gain function controller of claim 1, wherein the first plurality of sub-band signals comprise a first plurality of frequency bands of the first full-band signal, the second plurality of sub-band signals comprise a second plurality of frequency bands of the second full-band signal and the first plurality of frequency bands corresponds to the second plurality of frequency bands.

7. The gain function controller of claim 1, wherein the processor is further configured to determine the frequency-domain-gain-function based on one or more pluralities of further-sub-band-signals derived from one or more further-full-band-signals, and a power of each of the one or more further-full-band signals and/or a plurality of power levels of the one or more further-sub-band signals.

8. An integrated circuit or an electronic device comprising the gain function controller of claim 1.

* * * * *